United States Patent [19]

Nuechterlein

[11] Patent Number: 5,434,528
[45] Date of Patent: Jul. 18, 1995

[54] GATE DRIVE USING CONTINUOUS ALTERNATING POWER AND A DIODE H-BRIDGE

[75] Inventor: Paul E. Nuechterlein, Rockford, Ill.

[73] Assignee: Sundstrand Corporation, Rockford, Ill.

[21] Appl. No.: 235,754

[22] Filed: Apr. 29, 1994

[51] Int. Cl.⁶ .................... H03K 17/687; H03K 17/74
[52] U.S. Cl. .................................... 327/427; 327/448; 327/494; 327/588
[58] Field of Search .................. 327/427, 430–437, 327/447, 448, 494–497, 508, 587, 588, 423, 190, 300, 304

[56] References Cited

U.S. PATENT DOCUMENTS

| | | | |
|---|---|---|---|
| Re. 33,378 | 10/1990 | Mehl | 307/270 |
| 4,634,903 | 1/1987 | Montorfano | 327/432 |
| 4,906,876 | 3/1990 | Landseadel | 327/432 |
| 5,055,722 | 10/1991 | Latos et al. | 307/570 |
| 5,204,561 | 4/1993 | Rischmüller | 327/427 |
| 5,302,862 | 4/1994 | Steigerwald | 307/282 |

Primary Examiner—John S. Heyman
Assistant Examiner—Toan Tran
Attorney, Agent, or Firm—Jeffery J. Makeever

[57] ABSTRACT

A gate drive circuit for a power switching device having first and second power terminals and a gate terminal comprises an H-bridge rectifier having first, second, third, and fourth rectifiers, the anodes of the first and second rectifiers being mutually coupled at a midpoint to the cathodes of the third and fourth rectifiers. This midpoint is coupled to the gate terminal of the power switching device. A continuous alternating waveform generator is coupled to output selection control logic which selectively applies the waveform to either a first transformer, whose secondary is coupled to the anodes of the third and fourth rectifiers of the H-bridge for transforming the waveform from a control signal reference system to a power signal reference system, or to a second transformer, whose secondary side is coupled to the cathodes of the first and second rectifiers of the H-bridge for transforming the waveform from the control signal reference system to the power signal reference system. The output selection control logic applies the waveform to the first transformer to drive the power switching device into conduction, and alternatively to the second transformer to drive the power switching device out of conduction.

17 Claims, 5 Drawing Sheets

GATE DRIVE USING CONTINUOUS ALTERNATING POWER AND A DIODE H-BRIDGE

FIELD OF THE INVENTION

This invention relates to electronic gate drive circuits, and more particularly to a gate drive circuit which provides isolation between the control and the power circuits, very fast switching without delay between positive and negative drive voltages, and utilizes a continuous alternating voltage to affirmatively drive a power switching device into and out of conduction.

BACKGROUND ART

In power conversion equipment such as a 400 Hz inverter for an aircraft, power transistors which switch from non conducting to conducting states are used to control the flow of power. Increasingly, newer power conversion equipment use power transistors that are controlled by a gate terminal. These devices include field effect transistors (FETs), MOS controlled thyristors (MCTs), and insulated gate bipolar transistors (IGBTs). The voltage between this gate and a power terminal (Vg) of the power transistor must be changed to switch the conduction state. In many power electronics applications, the gate drive circuit which supplies this changing voltage must meet three basic requirements. First, it must supply dielectric isolation between a control circuit (which determines when a power transistor must conduct load current) and the transistor's terminals. Second, the drive circuit must supply a positive gate voltage (Vg) to the power transistor to ensure a conducting state, and must supply a negative gate voltage to ensure a non conducting state. Third, delays introduced by the drive circuit must be limited to a few hundred nanoseconds so that harmonic distortion is not increased in applications where precise switching angles are required, for example aircraft power generating systems.

FIG. 1 shows a gate drive circuit shown in a recent power electronics book (POWER ELECTRONICS: Converters, Applications, and Design by Mohan, Undeland, and Robbins, Wiley, New York, 1989). Although simple, this gate drive circuit suffers from an inability during startup of the power circuit to ensure a reverse gate voltage on one power transistor prior to the turn-on of another. Also, it introduces a significant turnoff delay because R2 and C2 must discharge before turnoff can occur. This delay cannot be reduced in this circuit because the time constant of R2 and C2 must be long enough to avoid inadvertent turnoff during transitions of the voltage on the transformer.

The instant invention is directed at overcoming one or more of the above problems by novel means heretofore unknown in the art.

SUMMARY OF THE INVENTION

It is the primary objective of the instant invention to provide a new and improved gate drive circuit to drive power switching devices into and out of conduction. More specifically, it is an objective of the instant invention to provide a gate drive circuit which will affirmatively drive and re-affirm the state of a power switching device by using a continuous alternating waveform.

The instant invention is a gate drive circuit for driving a power switching device, having first and second power terminals and a gate terminal, into and out of conduction. This gate drive circuit comprises an H-bridge rectifier having first, second, third, and fourth rectifiers, each having an anode and a cathode. The rectifiers are configured such that the anodes of the first and second rectifiers are mutually coupled at a midpoint to the cathodes of the third and fourth rectifiers. This midpoint is coupled to the gate terminal of the power switching device. This gate drive further comprises a continuous alternating waveform generator. This waveform is coupled to output selection control logic which selectively applies the waveform to first and second waveform output terminals. The gate drive of the instant invention further comprises a first waveform isolator having a primary side coupled to the first output terminal of the selection control logic, and a secondary side coupled to the anodes of the third and fourth rectifiers of the H-bridge. This waveform isolator transforms the continuous alternating waveform from a control signal reference system to a power signal reference system. Additionally, a second waveform isolator having a primary side coupled to the second output terminal of the selection control logic, and a secondary side coupled to the cathodes of the first and second rectifiers of the H-bridge. This isolator also transforms the continuous alternating waveform from a control signal reference system to a power signal reference system. The output selection control logic applies the continuous alternating waveform to the first waveform output terminal to drive the power switching device into conduction, and alternatively to the second waveform output terminal to drive the power switching device out of conduction.

Further in accordance with the instant invention, a voltage divider couples the secondary of the first waveform isolator to the secondary of the second waveform isolator. This voltage divider establishes a positive on-voltage level and a negative off-voltage level. Preferably, the positive on-voltage and the negative off-voltage are of different magnitudes to facilitate turning on and turning off of the power switching device. Preferably, the voltage divider comprises at least one voltage regulating device for regulating the positive on-voltage to a maximum fixed magnitude.

BRIEF DESCRIPTION OF THE DRAWINGS

While the specification concludes with claims particularly pointing out and distinctly claiming that which is regarded as the present invention, the organization, the advantages, and further objects of the invention may be readily ascertained by one skilled in the art from the following detailed description when read in conjunction with the accompanying drawings in which:

DESCRIPTION OF THE PREFERRED EMBODIMENTS

Figure 1:
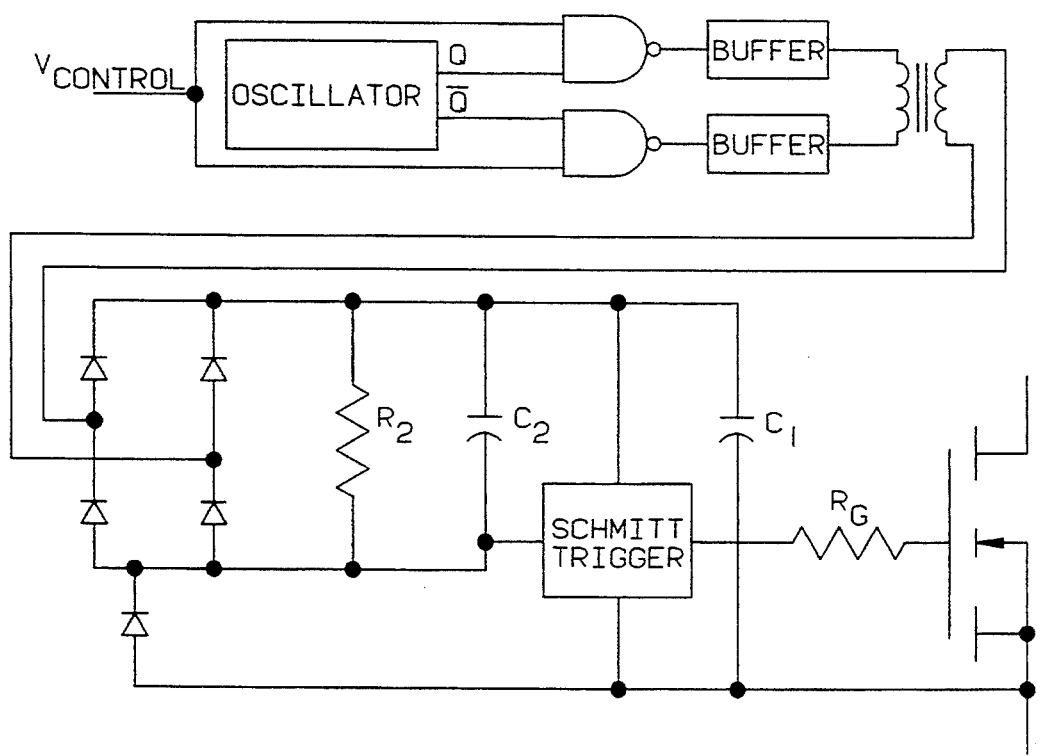
FIG. 1 is an electrical schematic illustration of a prior art gate drive circuit.
Figure 2:
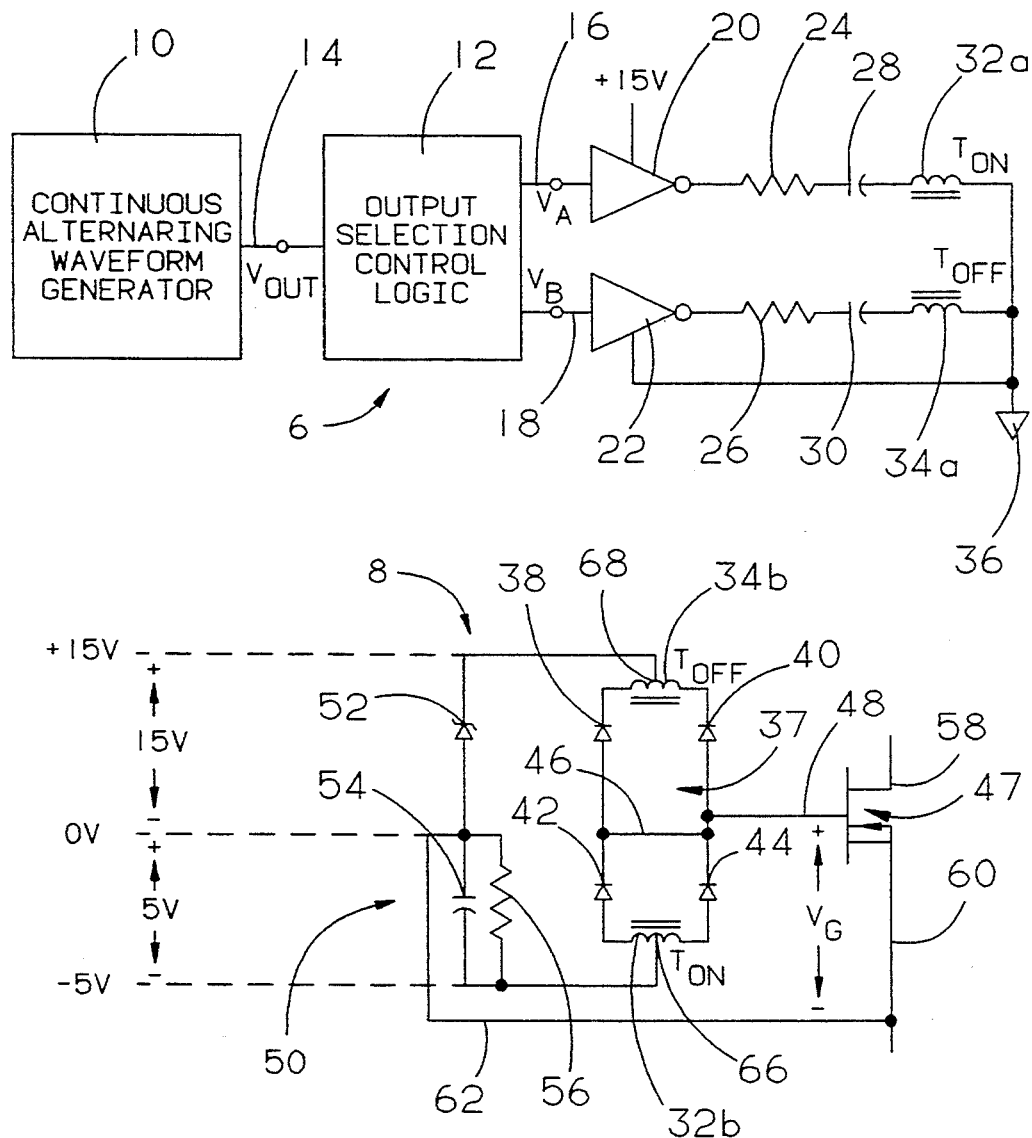
FIG. 2 is an electrical schematic illustration of an embodiment of the instant invention.

As illustrated in FIG. 2, a preferred embodiment of the instant invention comprises a primary control section 6 referenced to a control signal reference system 36, and a dielectrically isolated secondary section 8 referenced to a power signal reference system 62. The primary control section 6 comprises a means for generating a continuous alternating waveform, as illustrated by continuous alternating waveform generator 10, coupled to output selection control logic means 12 by line 14. This output selection control logic means 12 has a first waveform output terminal 16 which is coupled through driver 20, resistor 24, and capacitor 28 to the primary side 32a of a first waveform isolation means, as illustrated by transformer $T_{on}$. The output selection control logic means 12 also has a second waveform output terminal 18 which is coupled through driver 22, resistor 26, and capacitor 30 to the primary side 34a of a second waveform isolation means, as illustrated by transformer $T_{off}$.

The secondary section 8 of the preferred embodiment of the instant invention comprises an H-bridge rectifier 37 comprising a first rectifier 38 and a second rectifier 40 coupled by their anodes to a midpoint 46, and a third rectifier 42 and fourth rectifier 44 coupled by their cathodes to the same midpoint 46. This midpoint 46 is coupled to the gate terminal 48 of a power switching device 47, which also has first 58 and second 60 power terminals. The first transformer secondary side 32b is coupled to the anodes of the third 42 and fourth 44 rectifiers. The second transformer secondary side 34b is coupled to the cathodes of the first 38 and the second 40 rectifiers. A voltage divider means 50 is coupled between a center tap 66 of the first transformer secondary 32b and a center tap 68 of the second transformer secondary 34b. In a preferred embodiment of the instant invention, this voltage divider means 50 comprises at least one voltage regulating device, as illustrated in FIG. 2 by zener diode 52, in series with a resistor 56 and capacitor 54 combination.

Figure 3:
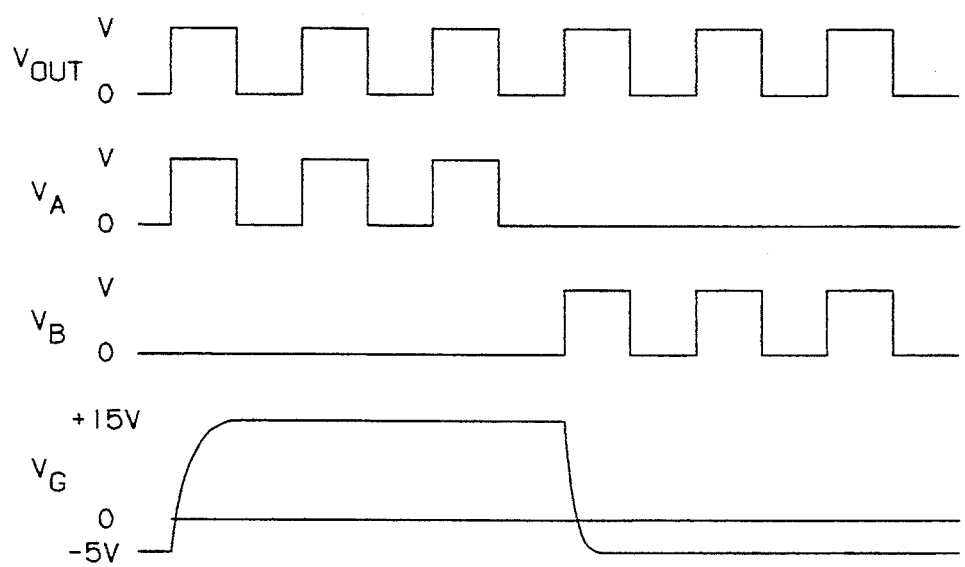
FIG. 3 is a waveform diagram illustrating the operation of the gate drive circuit of FIG.

The operation of this preferred embodiment can be understood with reference to FIG. 2, which illustrates the electrical schematic, and FIG. 3, which illustrates the waveform diagrams at various points in the gate drive of FIG. 2. A continuous alternating polarity waveform $V_{out}$ is generated by the waveform generator 10 and communicated to the output selection control logic 12 by line 14. This waveform can be any alternating polarity continuous waveform including a sine, triangular, or square wave. As illustrated in FIG. 3, a square wave $V_{out}$ is preferred. The output selection control logic 12 selectively applies the waveform to the first waveform output terminal 16 (see $V_A$ FIG. 3) to drive and maintain the power switching device 47 into conduction. This waveform is amplified by amplifier 20 and applied to the first transformer primary side 32a. The waveform is then electromagnetically coupled to the first transformer secondary side 32b. In this way, the waveform is transformed from a control ground reference system 36 to a power signal reference system 62 while maintaining a dielectric isolation between them. This transformed waveform is then rectified on alternate half cycles by the third 42 and fourth 44 rectifiers at the midpoint 46 of the H-bridge 37 (see FIG. 3 $V_g$). This rectified waveform Vg (see FIG. 3) maintains a relatively constant positive voltage at this midpoint 46. A positive value causes the power switching device 47 to conduct.

To drive and maintain the power switching device 47 out of conduction, the output selection control logic 12 selectively applies the waveform to the second waveform output terminal 18 (see $V_B$ FIG. 3). This waveform is amplified by amplifier 22 and applied to the second transformer primary side 34a. The waveform is then electromagnetically coupled to the second transformer secondary side 34b. In this way, the waveform is transformed from a control ground reference system 36 to a power signal reference system 62 while maintaining a dielectric isolation between them. This transformed waveform is then rectified on alternate half cycles by the first 38 and second 40 rectifiers at the midpoint 46 of the H-bridge 37 (see FIG. 3 Vg) to a continuous steady state magnitude. This rectified waveform Vg (see FIG. 3) maintains a relatively constant negative voltage at this midpoint 46. A negative value causes the power switching device 47 not to conduct.

The relative magnitude of the positive or negative rectified voltage at the midpoint 46 is established by the voltage divider 50. This divider 50 is designed to control the positive magnitude of Vg more precisely than the negative magnitude. This is compatible with the gate drive requirements of most power switching devices and results in a simpler, more cost-effective design. To accomplish this variation in magnitude, the upper or positive half of the voltage divider maintains a relatively constant voltage and the lower half establishes a relatively constant current. In a preferred embodiment, a voltage regulating device, such as is illustrated by zener diode 52, maintains the desired voltage magnitude, while resistor 56 maintains a constant current. Variations in the total voltage across the voltage divider 50 are caused by changes in the supply voltage in the primary section 6, by component changes, and by changing patterns in the gate voltage, Vg. These variations appear mainly as changes in the voltage across capacitor 54. Wide variations in this capacitor voltage (e.g. 5 V to 15 V) are generally acceptable and allow the preferred embodiment to be simpler, less costly, and to dissipate less power.

This preferred embodiment of the instant invention allows the power switching device 47 to be operated in a much higher noise environment than conventional gate drive designs. With the design of the instant invention, noise pulses which could otherwise change the state of the power switching device 47 are not a problem. Because most gate driver designs rely on the internal memory of the power switching device 47 to maintain the current conduction state, the introduction of a noise pulse, which is of sufficient magnitude to change the polarity of the gate voltage Vg, will cause a change of conduction state of the device, that is from non-conducting to conducting or vise versa. For applications such as in aircraft power generation systems, this erroneous turn on may cause destruction of the power switching device resulting from a "shoot through" condition (two power switching devices shorting across a 500 Vdc bus). Advantageously however, the instant invention utilizes a continuous alternating waveform which re-affirms the magnitude of the drive signal to the gate 48 every half cycle of this waveform. Since a typical power switching device 47 requires hundreds of nanoseconds to actually change conduction state after a change of polarity on the gate 48, this re-affirmance will drive the gate voltage Vg back to the correct polarity and magnitude before the power switching device can physically change conduction state.

Figure 4:
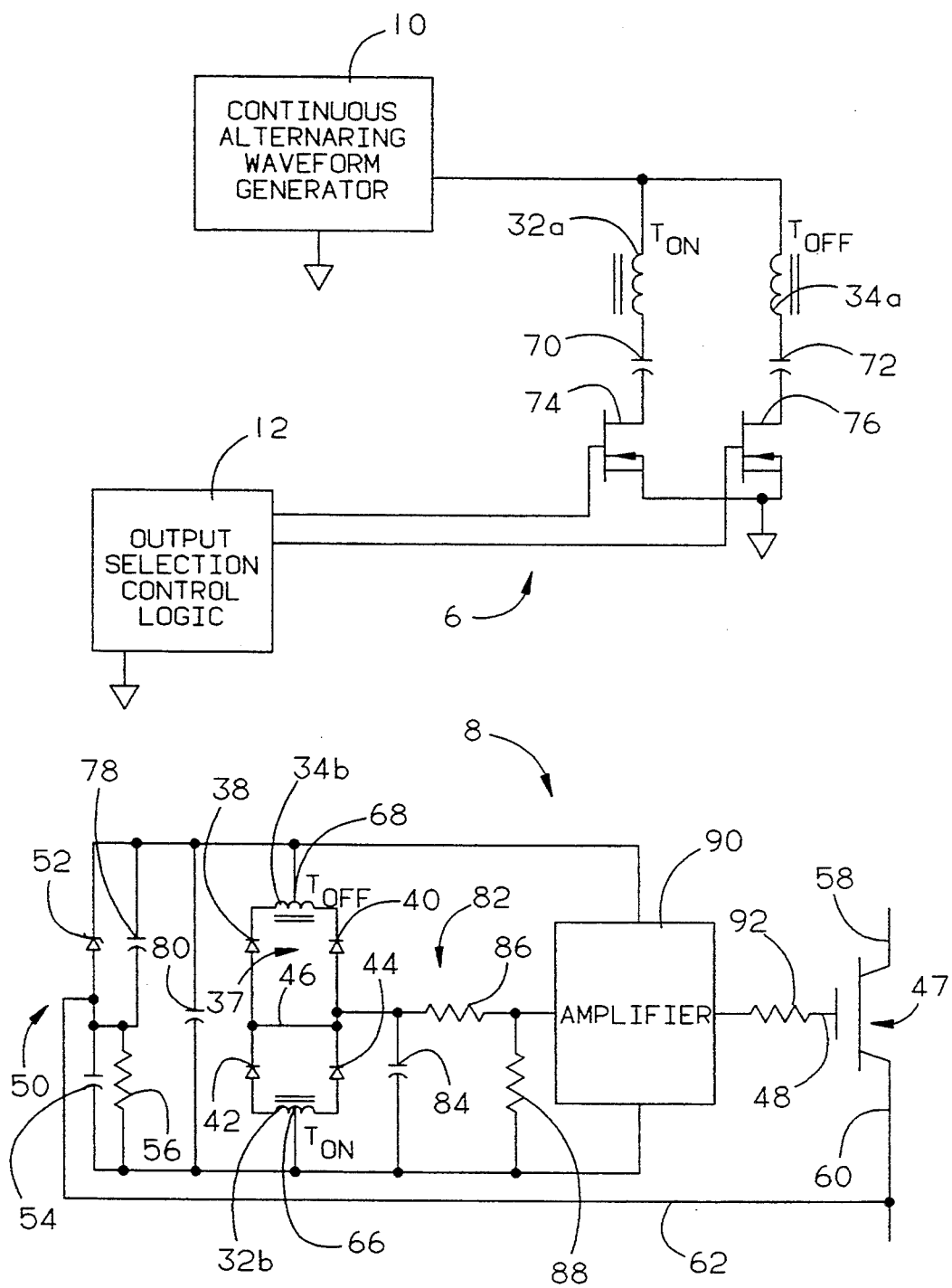
FIG. 4 is an electrical schematic illustration of an alternate embodiment of the instant invention.

An alternate embodiment as illustrated in FIG. 4 is based on the same principles as the embodiment illustrated in FIG. 2, but is optimized for high power applications such as a 20 kW aircraft inverter which supplies 400 Hz power. In the primary section 6 of this embodiment, switches, such as FETs 74, 76, allow power to flow directly from the waveform generator 10 through either the primary side 34a of the $T_{off}$ transformer and capacitor 70, or through the primary side 32a of the $T_{off}$ transformer and capacitor 72. Due to the replacement of the drivers 20, 22 of FIG. 2 with the FETs 74, 76, transformers may now operate at a higher frequency than the embodiment illustrated in FIG. 2, for example 5 MHz versus 500 kHz. This allows a reduction in the transformer size and a minimization of the variable delays caused by the time it takes for the primary side waveform generator 10 to change state. A smaller transformer size facilitates packaging and reduces primary-to-secondary capacitance, a source of undesirable current that can interfere with the circuit's operation.

In the secondary section 8 of this alternate embodiment, a low pass filter means 82 is added to remove any undesired ripple from the voltage at the midpoint 46. This low pass filter means may be of known design such as shown by capacitor 84. Resistors 86 and 88 scale the voltage magnitudes to be compatable with the amplifier input requirements. Also to aid in secondary voltage stabilization, capacitors 80 and 78 are also added. An amplifier 90 in the secondary section 8 serves to minimize delays caused by the internal capacitance (not shown) of the power switching devices 47. In this embodiment, a positive voltage at the midpoint 46 results in a positive voltage applied by amplifier 90 through resistor 92 to gate terminal 48. Output current from the amplifier 90 is larger to enable faster switching of the power switching device 47. Power for the driver is supplied by the three capacitors 54, 78, and 80. Power is returned to the capacitors 54, 78, and 80 by either transformer $T_{on}$ or $T_{off}$ in approximately 10 uS following a change to this value.

Figure 5:
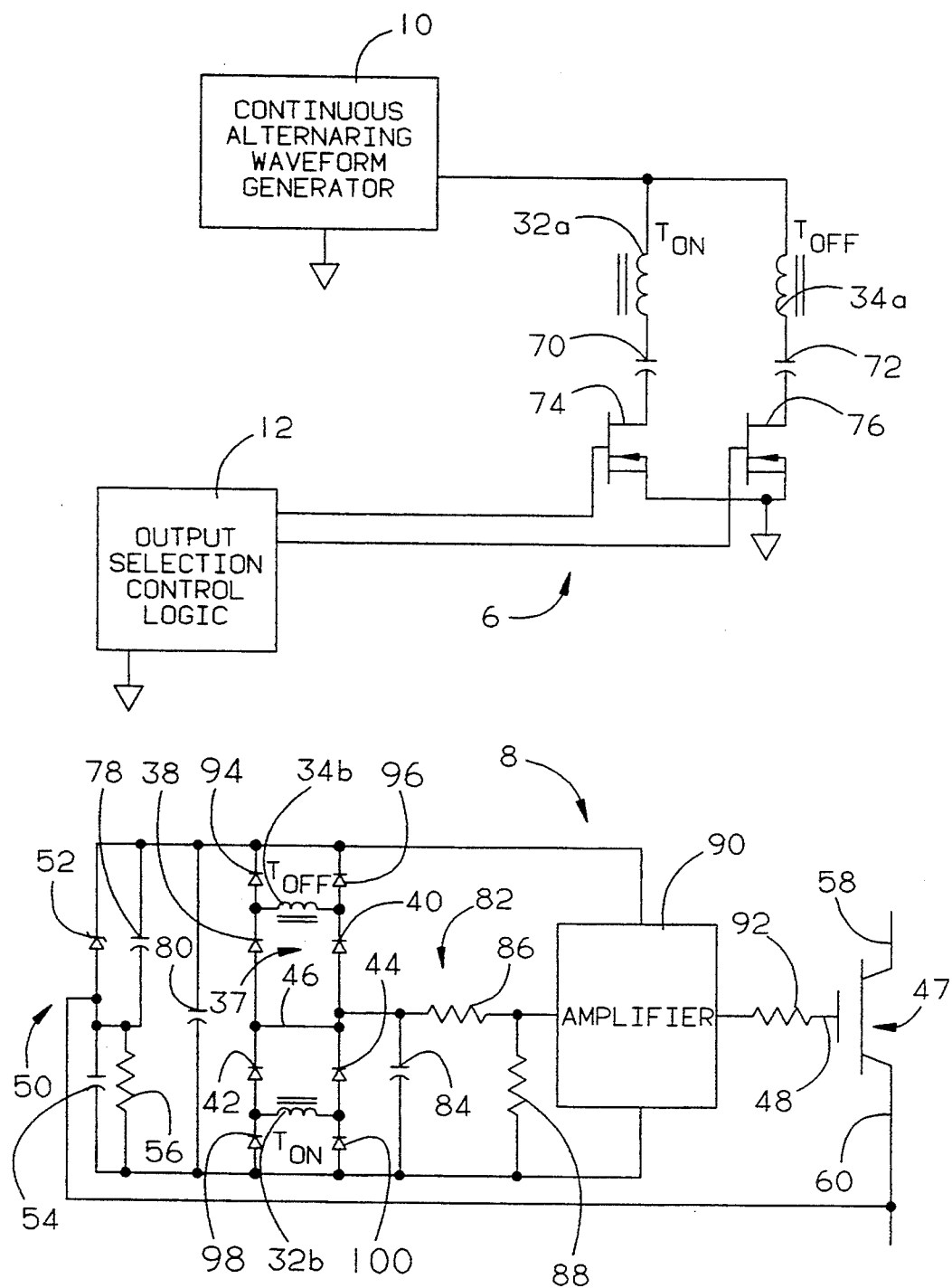
FIG. 5 is an electrical schematic illustration of a further embodiment of the instant invention.

A further alternate embodiment of the instant invention is illustrated in FIG. 5. This embodiment is similar to the embodiment shown in FIG. 4 and described above, except the center taps 66, 68 (FIG. 4) are replaced by fifth 98 and sixth 100 rectifiers, and seventh 94 and eighth 96 rectifiers respectfully. These rectifiers 94, 96, 98, and 100 simplify the construction of the transformers $T_{on}$ and $T_{off}$, although they add additional components to the secondary section 8.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

I claim:

1. A gate drive circuit for a power switching device having first and second power terminals and a gate terminal, comprising:
    an H-bridge rectifier having first, second, third, and fourth rectifiers, each of said rectifiers having an anode and a cathode, said anodes of said first and said second rectifiers mutually coupled at a midpoint to said cathodes of said third and said fourth rectifiers, said midpoint being coupled to the gate terminal of the power switching device;
    means for generating a continuous alternating waveform;
    output selection control logic means for receiving said continuous alternating waveform and for selectively applying said waveform to first and second waveform output terminals;
    a first waveform isolation means having a primary side coupled to said first output terminal of said selection control logic means, and a secondary side coupled to said anodes of said third and said fourth rectifiers of said H-bridge;
    a second waveform isolation means having a primary side coupled to said second output terminal of said selection control logic means, and a secondary side coupled to said cathodes of said first and said second rectifiers of said H-bridge; and wherein
    said output selection control logic means applies said waveform to said first waveform output terminal to drive the power switching device into conduction, and alternatively to said second waveform output terminal to drive the power switching device out of conduction.

2. The gate drive circuit of claim 1, further comprising voltage divider means for establishing a positive on-voltage level and a negative off-voltage level, said voltage divider means coupling said secondary of said first waveform isolation means to said secondary of said second waveform isolation means.

3. The gate drive circuit of claim 2, wherein said positive on-voltage level and said negative off-voltage level are of different magnitudes.

4. The gate drive circuit of claim 2, wherein said voltage divider means comprises at least one voltage regulating device for regulating said positive on-voltage to a maximum fixed magnitude.

5. The gate drive circuit of claim 1, wherein said first and said second waveform isolation means comprise first and second transformers.

6. The gate drive circuit of claim 5, further comprising voltage divider means for establishing a positive on-voltage level and a negative off-voltage level of different magnitudes, said voltage divider means coupling a center tap of said secondary of said first transformer to a center tap of said secondary of said second transformer.

7. The gate drive circuit of claim 6, wherein said voltage divider means comprises at least one voltage regulating device for regulating said positive on-voltage to a maximum fixed magnitude.

8. The gate drive circuit of claim 5, further comprising voltage divider means for establishing a positive on-voltage level and a negative off-voltage level, said voltage divider means coupling said secondary of said first transformer to said secondary of said second transformer through fifth and sixth rectifiers coupled across said secondary of said first transformer and through seventh and eighth rectifiers coupled across said secondary of said second transformer.

9. The gate drive circuit of claim 8, wherein said positive on-voltage level and said negative off-voltage level are of different magnitudes.

10. The gate drive circuit of claim 8, wherein said voltage divider means comprises at least one voltage regulating device for regulating said positive on-voltage to a maximum fixed magnitude.

11. The gate drive circuit of claim 1, wherein said continuous alternating waveform applied to said first waveform isolation means is rectified to a continuous steady state positive magnitude waveform at said midpoint of said H-bridge rectifier to drive and maintain the power switching device into conduction.

12. The gate drive circuit of claim 11, further comprising low pass filter means interposed between said midpoint of said H-bridge rectifier and the gate terminal of the power switching device to remove ripple from said continuous steady state positive magnitude waveform.

13. The gate drive circuit of claim 1, wherein said continuous alternating waveform applied to said second waveform isolation means is rectified to a continuous steady state negative magnitude waveform at said midpoint of said H-bridge rectifier to drive and maintain the power switching device out of conduction.

14. The gate drive circuit of claim 13, further comprising low pass filter means interposed between said midpoint of said H-bridge rectifier and the gate terminal of the power switching device to remove ripple from said continuous steady state negative magnitude waveform.

15. The gate drive circuit of claim 1, further comprising low pass filter means interposed between said midpoint of said H-bridge rectifier and the gate terminal of the power switching device.

16. The gate drive circuit of claim 1, further comprising first and second waveform amplifier means respectively, interposed between said first waveform output terminal and said first waveform isolation means, and between said second waveform output terminal and said second waveform isolation means.

17. The gate drive circuit of claim 1, further comprising waveform amplifier means interposed between said midpoint of said H-bridge rectifier and the gate terminal of the power switching device.

* * * * *